(12) United States Patent
Saito et al.

(10) Patent No.: US 10,897,265 B2
(45) Date of Patent: Jan. 19, 2021

(54) ANALOG-TO-DIGITAL CONVERSION DEVICE, PHOTOELECTRIC CONVERSION DEVICE, PHOTOELECTRIC CONVERSION SYSTEM, AND MOVABLE OBJECT

(71) Applicant: CANON KABUSHIKI KAISHA, Tokyo (JP)

(72) Inventors: Kazuhiro Saito, Tokyo (JP); Hideo Kobayashi, Tokyo (JP); Tetsuya Itano, Sagamihara (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/682,677

(22) Filed: Nov. 13, 2019

(65) Prior Publication Data

US 2020/0169265 A1    May 28, 2020

(30) Foreign Application Priority Data

Nov. 22, 2018 (JP) ................................ 2018-219744

(51) Int. Cl.
*H04N 5/378* (2011.01)
*H03M 1/56* (2006.01)
*B60Q 9/00* (2006.01)
*B60R 11/00* (2006.01)
*B60R 11/04* (2006.01)

(52) U.S. Cl.
CPC .............. *H03M 1/56* (2013.01); *H04N 5/378* (2013.01); *B60Q 9/008* (2013.01); *B60R 11/04* (2013.01); *B60R 2011/004* (2013.01)

(58) Field of Classification Search
CPC ......... H04N 5/378; H03M 1/56; B60Q 9/008; B60R 11/04; B60R 2011/004
USPC ........................................................... 348/148
See application file for complete search history.

(56) References Cited

U.S. PATENT DOCUMENTS

| | | | | |
|---|---|---|---|---|
| 4,600,916 A * | 7/1986 | Masuda | .................... | H03K 5/08 341/159 |
| 4,897,657 A * | 1/1990 | Brubaker | ........... | H03K 19/0948 341/159 |
| 5,225,837 A * | 7/1993 | Hosotani | ............... | H03M 1/362 341/158 |
| 6,189,420 B1 * | 2/2001 | Shiao | ..................... | B25G 1/066 403/84 |

FOREIGN PATENT DOCUMENTS

JP        2017-200062 A      11/2017

* cited by examiner

*Primary Examiner* — Michael Lee
(74) *Attorney, Agent, or Firm* — Canon U.S.A., Inc. IP Division

(57) ABSTRACT

An analog-to-digital conversion device of the embodiment includes a comparator and a logic circuit including a switch unit and a logic gate unit that receives a signal output from a comparator. The logic gate unit and the switch unit are connected to each other in series between a power supply node and a ground node.

18 Claims, 12 Drawing Sheets

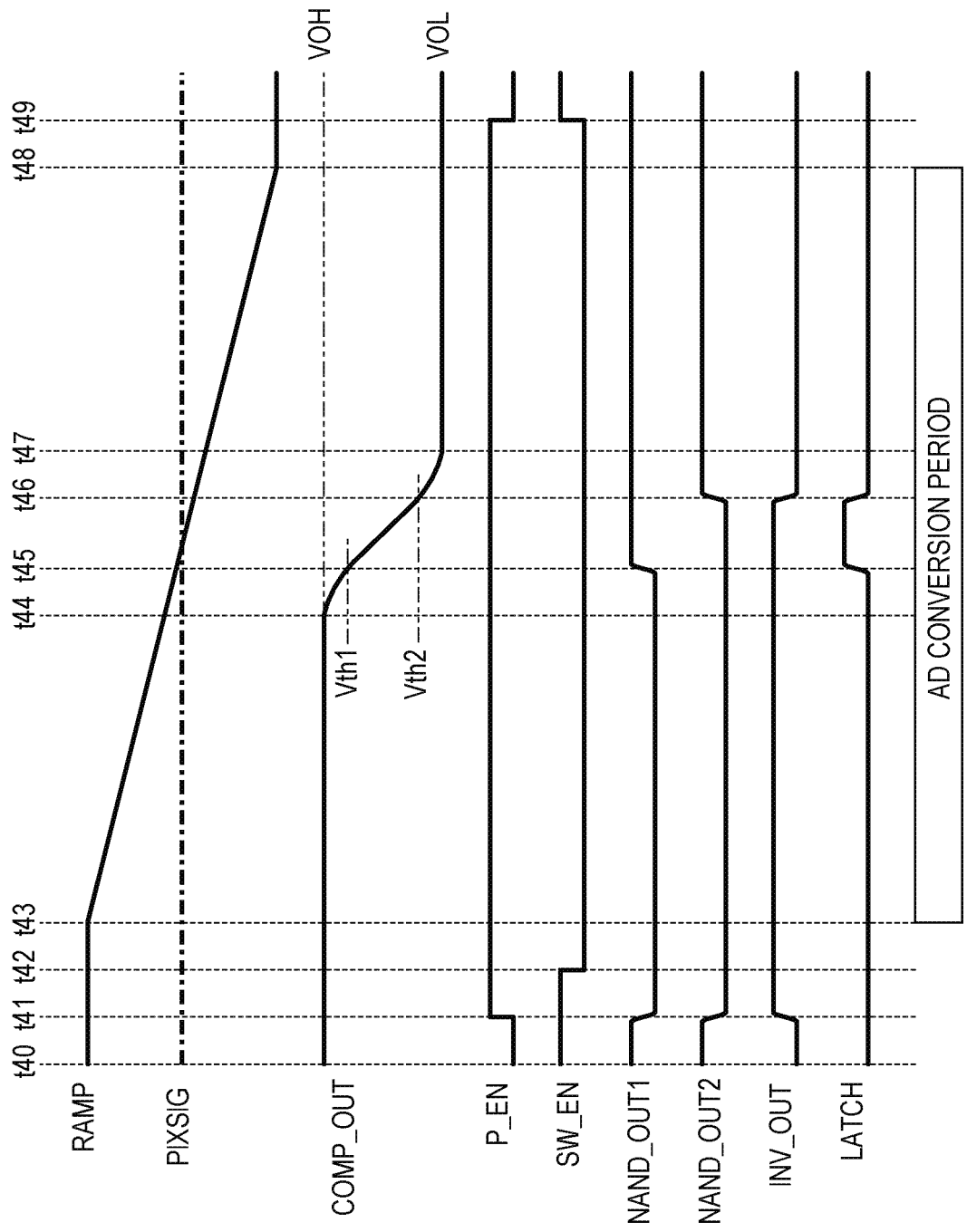

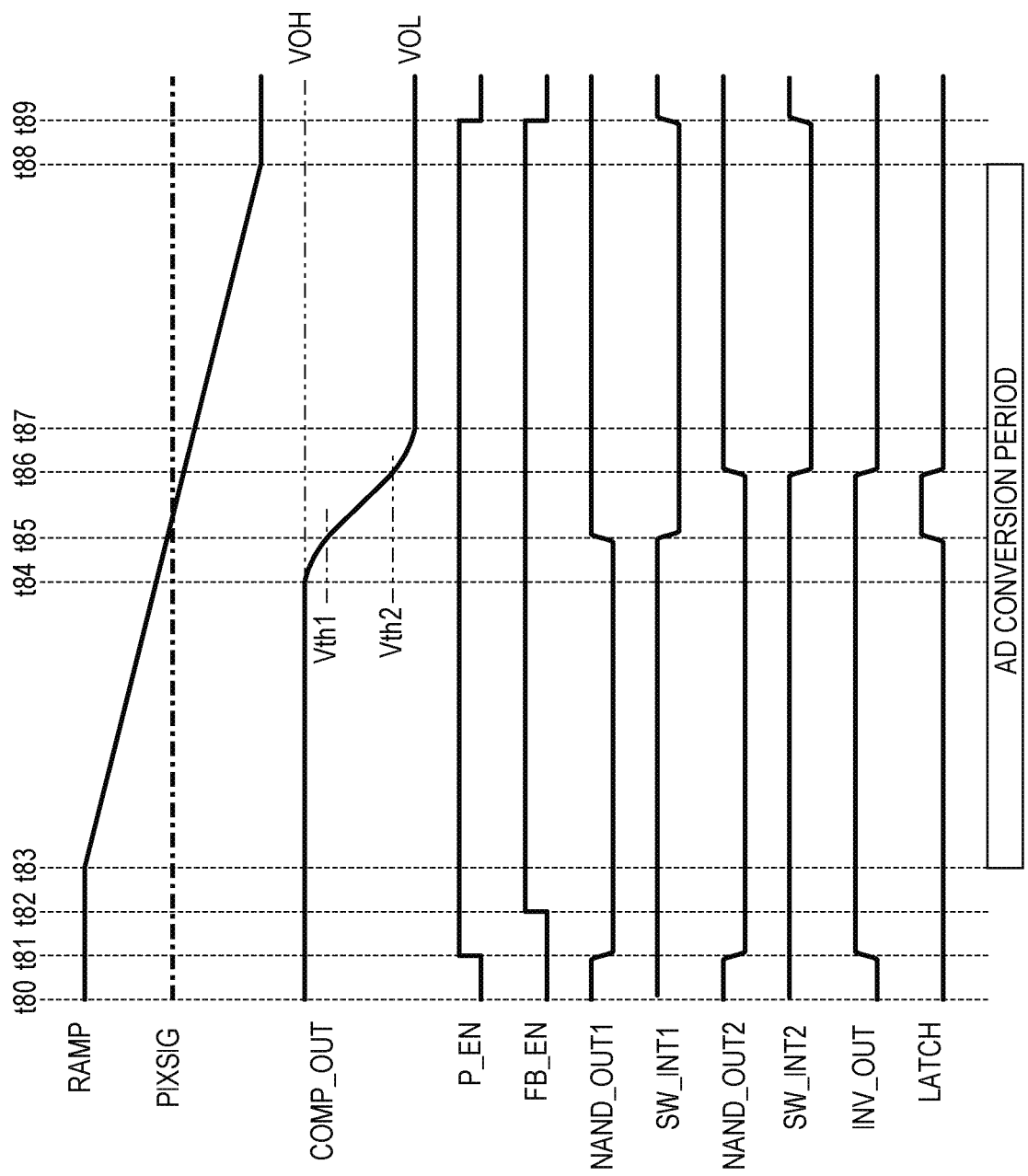

ANALOG-TO-DIGITAL CONVERSION DEVICE, PHOTOELECTRIC CONVERSION DEVICE, PHOTOELECTRIC CONVERSION SYSTEM, AND MOVABLE OBJECT

BACKGROUND

Field

One disclosed aspect of the embodiments relates to an analog-to-digital conversion device, a photoelectric conversion device, a photoelectric conversion system, and a movable object.

Description of the Related Art

Japanese Patent Application Laid-Open No. 2017-200062 discloses a photoelectric conversion device on which an analog-to-digital (AD) conversion circuit is mounted. The AD conversion circuit disclosed in Japanese Patent Application Laid-Open No. 2017-200062 includes a pulse generation circuit that generates pulses based on an output signal of a comparator and a threshold value of a logic gate.

In the AD conversion circuit disclosed in Japanese Patent Application Laid-Open No. 2017-200062, when the level of the output signal of the comparator is close to the threshold value of the logic gate, a through current may occur between the power supply node and the ground node. In particular, when the comparator operates at a low output through rate, the through current may affect accuracy of AD conversion.

SUMMARY

One aspect of the embodiments intends to improve accuracy of AD conversion in an AD conversion device or a photoelectric conversion device.

An AD conversion device of one embodiment includes a comparator and a logic circuit including a switch circuit or unit and a logic gate circuit or unit that receives a signal output from the comparator, and the logic gate unit and the switch unit are connected to each other in series between a power supply node and a ground node.

Further features of the disclosure will become apparent from the following description of exemplary embodiments with reference to the attached drawings.

BRIEF DESCRIPTION OF THE DRAWINGS

FIG. 4 is a timing chart diagram of signals used for driving the imaging device.

FIG. 8 is a timing chart diagram of signals used for driving the imaging device.

DESCRIPTION OF THE EMBODIMENTS

Preferred embodiments of the disclosure will now be described in detail in accordance with the accompanying drawings.

The embodiments of the disclosure will be described in detail below by using the drawings. The disclosure is not limited to only the embodiments described below. A modified example in which a part of the configuration of the embodiment described below is changed within the scope not departing from the spirit of the disclosure is also one of the embodiments of the disclosure. Further, an example in which a part of the configuration of any of the embodiments described below is added to another embodiment or an example in which a part of the configuration of any of the embodiments is replaced with a part of the configuration of another embodiment is also one of the embodiments of the disclosure.

First Embodiment

A first embodiment will be described with reference to the drawings. An analog-to-digital conversion device (hereinafter, an AD conversion device) of the first embodiment is mounted in a photoelectric conversion device and performs analog-to-digital conversion (hereinafter, AD conversion) on a signal based on charge generated by photoelectric conversion. The photoelectric conversion device of the present embodiment is formed as an imaging device used for a camera, a machine vision, or an on-vehicle sensor.

Figure 1:
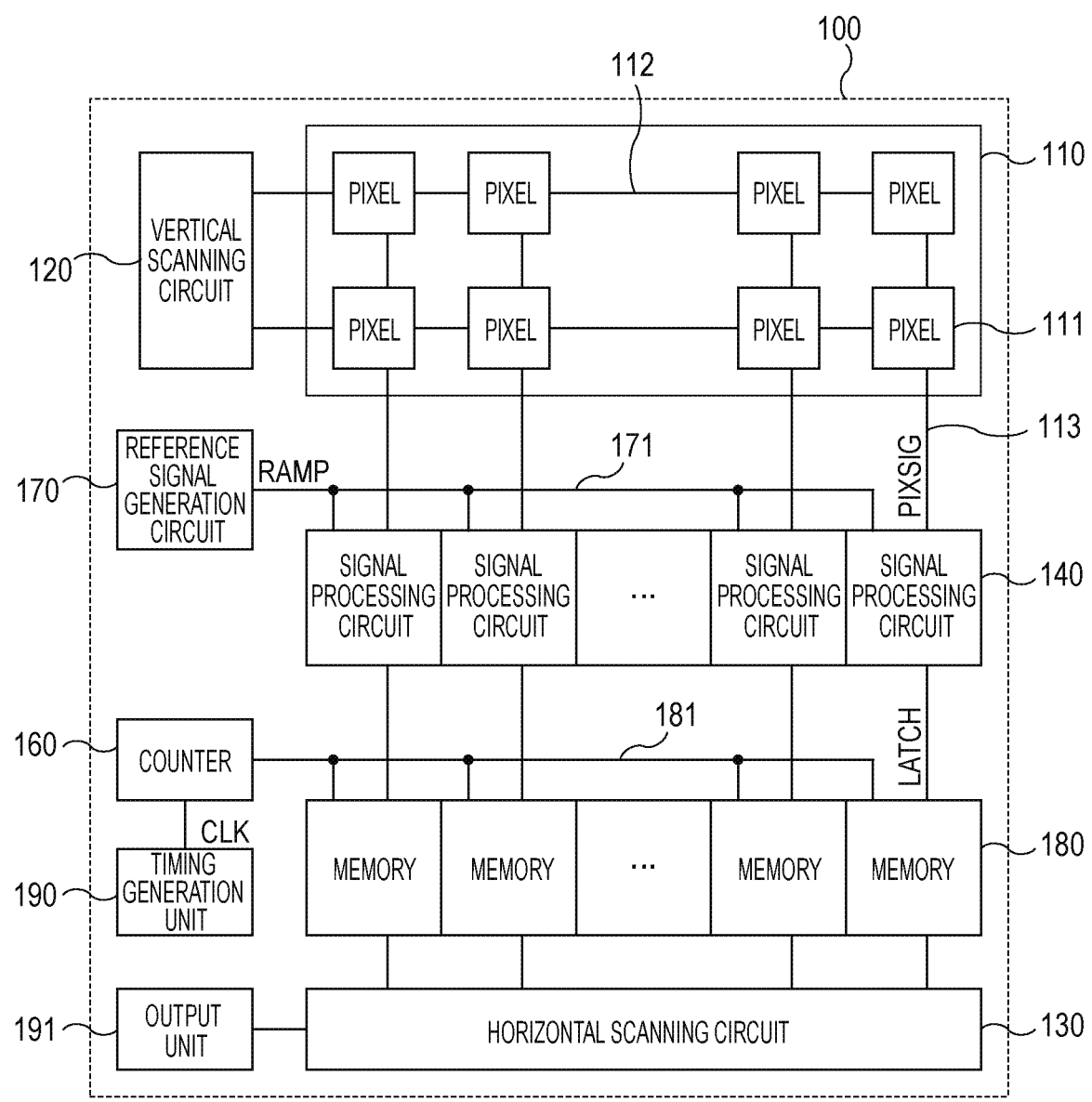
FIG. 1 is a diagram schematically illustrating an entire structure of an imaging device.

FIG. 1 is a block diagram schematically illustrating the entire structure of an imaging device 100 according to the present embodiment. The imaging device 100 includes a plurality of pixels 111 arranged in an imaging region 110. Each of the pixels 111 includes a photoelectric conversion unit and outputs a pixel signal based on charge generated by photoelectric conversion. The plurality of pixels 111 are arranged so as to form a matrix including a plurality of pixel rows and a plurality of pixel columns. While FIG. 1 illustrates the pixels 111 included in two pixel rows, the number of the pixel rows formed by the pixels 111 is not limited thereto.

The imaging device 100 further includes a vertical scanning circuit 120, a horizontal scanning circuit 130, signal processing circuits 140, a counter 160, a reference signal generation circuit 170, memories 180, a timing control unit 190, and an output unit 191. Further, the imaging device 100 includes a row control line 112, an output line 113, a reference signal line 171, and a count signal line 181.

A plurality of output lines 113 are provided in association with a plurality of pixel columns. Pixel signals from the pixels 111 on a corresponding pixel column are output to each of the plurality of output lines 113. Note that an optical signal PIXSIG based on charge generated by photoelectric conversion is an example of pixel signals. A pixel signal may be a noise signal output from the pixel 111 in a reset state, for example.

The vertical scanning circuit 120 is electrically connected to the plurality of pixels 111 via a plurality of row control lines 112. One row control line 112 is provided commonly in association with a plurality of pixels 111 forming one pixel row. The vertical scanning circuit 120 supplies a control signal to the plurality of row control lines 112 based on a control signal supplied from the timing control unit 190. When a control signal of a row control line 112 is activated, each pixel 111 connected to the row control line 112 outputs a pixel signal to the corresponding output line 113. When control signals of a plurality of row control lines are sequentially activated by the vertical scanning circuit 120, the pixel signals from the plurality of pixels 111 are sequentially output to the output line 113.

The reference signal generation circuit 170 generates a ramp signal RAMP. The ramp signal RAMP is a reference signal having a signal level that monotonically changes as time elapses. The reference signal generation circuit 170 supplies the ramp signal RAMP to each of the plurality of signal processing circuits 140 via the reference signal line 171. The reference signal generation circuit 170 starts changing the signal level of the ramp signal RAMP based on a control signal supplied from the timing control unit 190.

An output node of the signal processing circuit 140 is electrically connected to the corresponding memory 180. The signal processing circuit 140 supplies a latch pulse signal LATCH to the corresponding memory 180. As described below, the signal processing circuit 140 outputs the latch pulse signal LATCH based on a comparison result between a pixel signal (optical signal PIXSIG, for example) and the ramp signal RAMP from the pixel 111.

The latch pulse signal LATCH has a predetermined pulse width. In other words, the latch pulse signal LATCH is activated only for a predetermined period. Note that signal levels of the latch pulse signal LATCH for the active state and the inactive state are appropriately set in accordance with a post-stage circuit.

The counter 160 supplies a count signal COUNT to each of the plurality of memories 180 via a count signal line 181. The counter 160 counts a pulse of a clock signal CLK supplied from the timing control unit 190 and outputs a count signal COUNT. The count signal COUNT may be a Gray-code in which the Humming distance between preceding and subsequent count values is maintained at 1. Further, the count signal line 181 includes a bus interconnection of a plurality of bits. In the present embodiment, the count signal line 181 includes a bus interconnection of 5 bits.

Note that the imaging device 100 of the present embodiment includes one counter 160 and a plurality of memories 180. As a modified example, the imaging device 100 may have a plurality of counters. Each of the plurality of counters is electrically connected to corresponding one of the plurality of signal processing circuits 140. Each of the plurality of counters then starts or stops counting in response to the latch pulse signal LATCH output from the signal processing circuit 140. When the counter is configured to hold a count value, the memories 180 are omitted.

The horizontal scanning circuit 130 sequentially scans the plurality of memories 180 and sequentially outputs a plurality of signals held in the plurality of memories 180 to the output unit 191.

Figure 2:
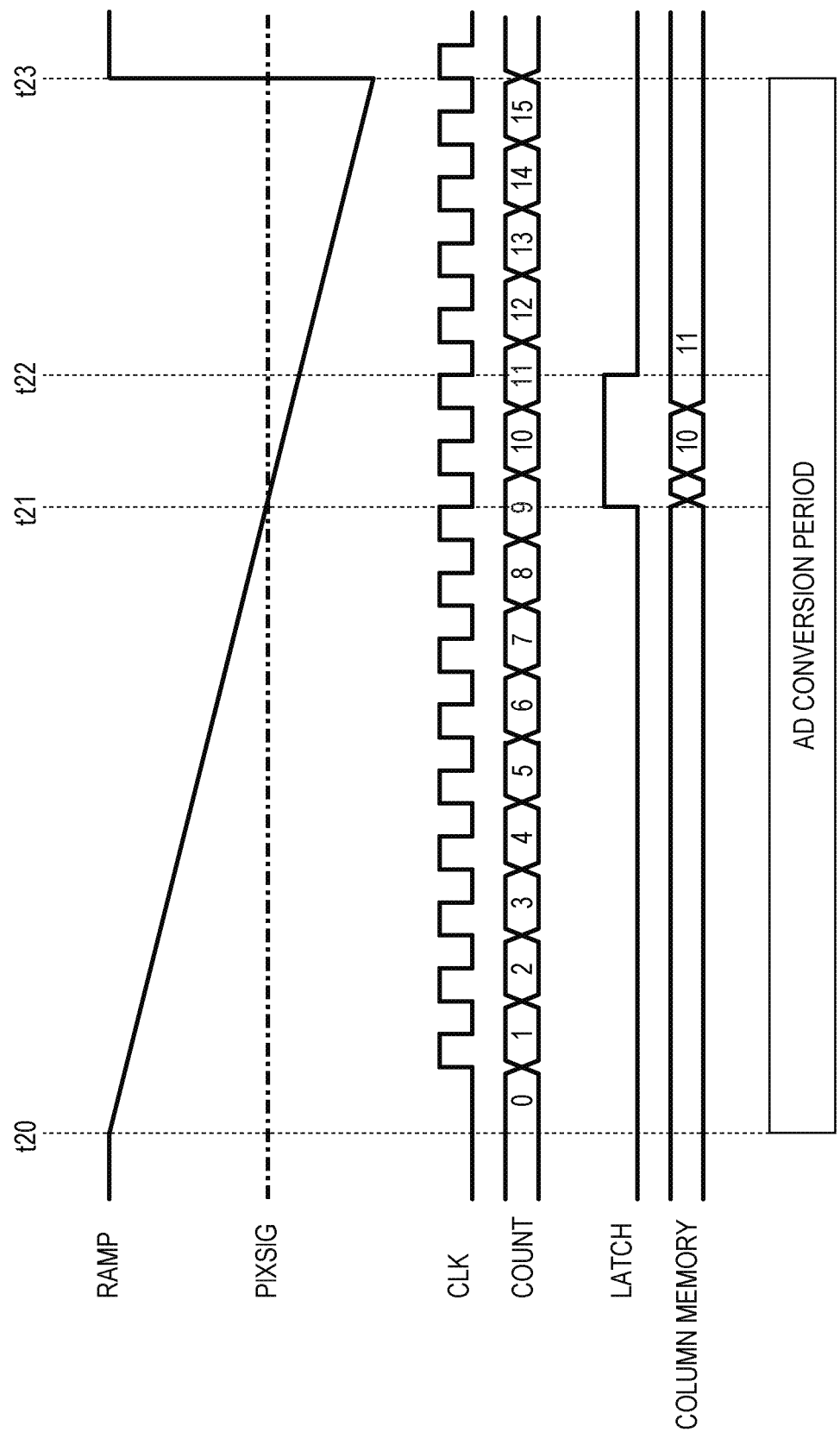
FIG. 2 is a timing chart diagram of signals used for driving the imaging device.

Next, the operation of the imaging device 100 of FIG. 1 will be described with reference to FIG. 2. FIG. 2 illustrates the ramp signal RAMP, the clock signal CLK, the count signal COUNT, and the latch pulse signal LATCH. Further, FIG. 2 illustrates the signal levels of the optical signal PIXSIG and the count signal (digital signal) held in the memory 180. FIG. 2 illustrates a timing chart of each signal when the imaging device 100 converts the optical signal PIXSIG into a digital signal.

Note that, to simplify the drawings, each of the count signal COUNT and the count signal held by the memory 180 (digital signal) is represented by using a decimal number. In the actual situation, each signal is represented in a 5-bit Gray-code.

First, at time t20, an AD conversion period starts, and the pixel 111 outputs the optical signal PIXSIG to the output line 113. At the time t20, the reference signal generation circuit 170 starts changing the signal level of the ramp signal RAMP under the control of the timing control unit 190. Further, at the time t20, the counter 160 starts counting the pulse of the clock signal CLK. At this time, the signal level of the ramp signal RAMP is greater than the signal level of the optical signal PIXSIG.

At time t21, the relationship between the signal level of the optical signal PIXSIG and the signal level of the ramp signal RAMP from the pixel 111 is inverted. At the time t21 when the signal level of the optical signal PIXSIG becomes greater than the signal level of the ramp signal RAMP, the signal processing circuit 140 causes the latch pulse signal LATCH to transition from the inactive state to the active state. In the present embodiment, the inactive state corresponds to a low level, and the active state corresponds to a high level. At time t22 when a predetermined time period has elapsed from the time t21, the signal processing circuit 140 causes the signal level of the latch pulse signal LATCH to transition from the active state to the inactive state. As described above, the signal level of the latch pulse signal LATCH changes in accordance with a result of the comparison performed by the signal processing circuit 140.

When the latch pulse signal LATCH is in the active state, the memory 180 takes in the count signal COUNT that is currently being supplied to the memory 180. Therefore, at the time t22 when the signal level of the latch pulse signal LATCH changes from the active state to the inactive state, the memory 180 holds the count signal COUNT that is currently being generated. As a result, the memory 180 holds a count value (digital signal) corresponding to the period from the time t20 when the change of the signal level of the ramp signal RAMP starts to the time t22 when the signal level of the latch pulse signal LATCH transitions to the inactive state.

At time t23, the AD conversion period ends, and the reference signal generation circuit 170 also stops the change of the signal level of the ramp signal RAMP with time. Subsequently, the horizontal scanning circuit 130 sequentially scans the plurality of memories 180 and sequentially outputs digital signals held by the plurality of memories 180 to the output unit 191.

Next, the configuration of the signal processing circuit 140 will be described. As described above, the signal processing circuit 140 of the present embodiment performs a part of the process of AD conversion. That is, the signal processing circuit 140 forms an AD conversion device.

Figure 3A:
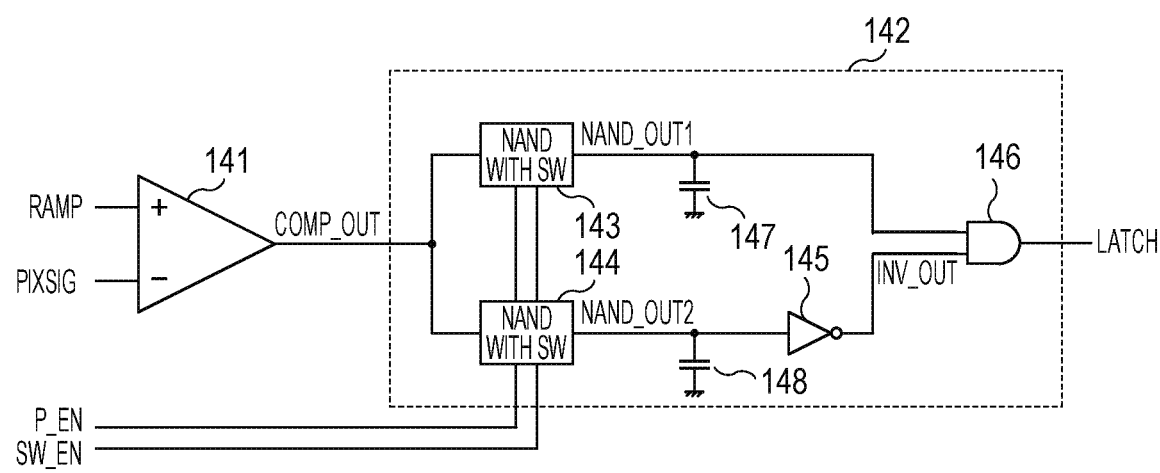
FIG. 3A, FIG. 3B and FIG. 3C are diagrams illustrating equivalent circuits of a signal processing circuit of the imaging device.

FIG. 3A is a diagram illustrating an example of an equivalent circuit of the signal processing circuit 140. The signal processing circuit 140 includes a comparator 141 and a pulse generation circuit 142. The pulse generation circuit 142 is formed of a NAND circuit 143, a NAND circuit 144, an inverter circuit 145, and an AND circuit 146. Each of the NAND circuit 143 and the NAND circuit 144 performs a NAND logical operation on a plurality of input signals and outputs a signal representing the result. The AND circuit 146 performs an AND logical operation on a plurality of input signals and outputs a signal representing the result. The inverter circuit 145 inverts an input signal. While details will be described later, a logic circuit (the NAND circuits 143 and 144 in the present example) forming an input unit of the pulse generation circuit 142 includes a logic gate unit and a switch unit that is connected in series to the logic gate unit.

A load capacitor 147 and a load capacitor 148 are connected to an output node NAND_OUT1 of the NAND circuit 143 and an output node NAND_OUT2 of the NAND circuit 144, respectively. Each of the load capacitor 147 and the load capacitor 148 may be a parasitic capacitance component coupled to interconnections or a capacitor element such as a MIM capacitor, a PIP capacitor, a MOS capacitor, or the like.

The optical signal PIXSIG and the ramp signal RAMP are input to the comparator 141. The comparator 141 outputs an output signal COMP_OUT based on the result of comparison of the optical signal PIXSIG with the ramp signal RAMP. In the example of FIG. 3A, the optical signal PIXSIG and the ramp signal RAMP are directly input to the comparator 141. As a modified example, the optical signal PIXSIG and the ramp signal RAMP may be input to the comparator 141 due to capacitive coupling. In such a configuration, an auto zero operation of the comparator 141 can be performed.

The NAND circuit 143 and the NAND circuit 144 are the input units of the pulse generation circuit 142 that receive the output signal COMP_OUT of the comparator 141. In the present embodiment, a logic circuit forming the input unit of the pulse generation circuit 142 includes a logic gate unit and a switch unit connected in series to the logic gate unit. The logic gate unit receives at least two input signals and outputs a signal corresponding to a combination of signal values of at least the two input signals. The switch unit receives a control signal different from the input signals received by the logic gate unit. A control signal controls the switch unit to an on-state (conductive state) or an off-state (non-conductive state). With such a configuration, it is possible to improve accuracy of AD conversion.

Figure 3B:
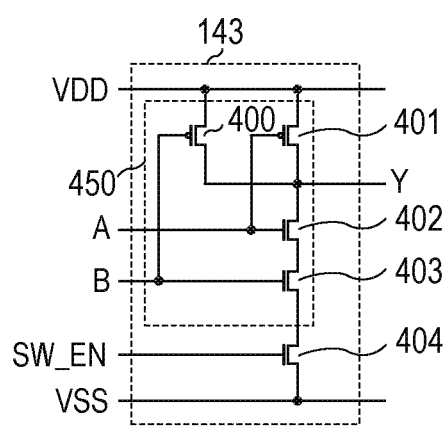

FIG. 3B illustrates an equivalent circuit diagram of the NAND circuit 143. Note that the NAND circuit 144 has the same circuit configuration as the NAND circuit 143. Therefore, the description related to the NAND circuit 143 also applies to the NAND circuit 144 unless otherwise noted.

The NAND circuit 143 includes a logic gate unit 450 and a switch unit 404. The logic gate unit 450 and the switch unit 404 are connected to each other in series between the power supply node VDD and the ground node VSS.

The logic gate unit 450 is formed of a p-channel MOS transistor (hereinafter, PMOS) 400, a PMOS 401, an n-channel MOS transistor (hereinafter, NMOS) 402, and an NMOS 403. Each gate of the PMOS 400, the PMOS 401, the NMOS 402, and the NMOS 403 is connected to either an input terminal A or an input terminal B of the NAND circuit 143. These four transistors perform a NAND logical operation on the signal input to the input terminal A and the signal input to the input terminal B and output a signal representing a result of the logical operation to an output terminal Y.

The switch unit 404 is formed of an NMOS 404. The gate of the NMOS 404 is electrically isolated from the input terminal A and the input terminal B. Further, a control signal different from the input signal on which an NAND logical operation is to be performed is supplied to the gate of the NMOS 404. Therefore, even when a current path in the logic gate unit 450 is not disconnected by input signals of the input terminal A and the input terminal B, a current path in the switch unit 404 can be disconnected by a separate control signal. Further, the switch unit 404 is connected to the logic gate unit 450 at a node different from the input terminal A and the input terminal B of the logic gate unit 450 and the output terminal Y. Typically, the switch unit 404 is connected between a power voltage supply terminal of the logic gate unit 450 and the power supply node VDD or between a ground voltage supply terminal of the logic gate unit 450 and the ground node VSS. With such a configuration, it is possible to prevent a current from occurring between the power supply node VDD and the ground node VSS or reduce the amount of current flowing from the power supply node VDD to the ground node VSS.

Figure 3C:
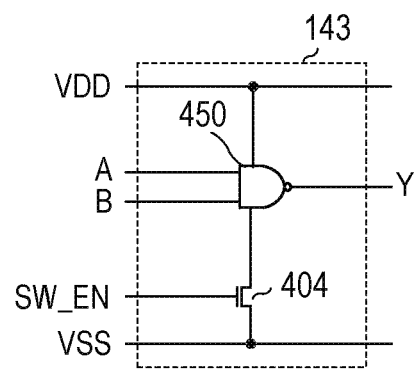

FIG. 3C illustrates an equivalent circuit of the NAND circuit 143 simplified by using an NAND gate circuit symbol for the logic gate unit 450. As illustrated in FIG. 3C, the logic gate unit 450 and the switch unit 404 are connected to each other so as to form a current path between the power supply node VDD and the ground node VSS.

The output signal COMP_OUT from the comparator 141 illustrated in FIG. 3A is input to the input terminal A of the NAND circuit 143. A control signal P_EN illustrated in FIG. 3A is input to the input terminal B of the NAND circuit 143. The control signal P_EN is a signal that controls whether or not to perform AD conversion based on the comparison result of the comparator 141. A control signal SW_EN is input to the gate of the NMOS 404. A Hi-level of each of the control signal P_EN and the control signal SW_EN is equal to the voltage of the power supply node VDD. Further, a Lo-level is equal to the voltage of the ground node VSS.

When the control signal SW_EN is at the Hi-level, the NAND circuit 143 outputs an output signal NAND_OUT1 indicating the NAND logical operation result of the output signal COMP_OUT and the control signal P_EN. Similarly, when the control signal SW_EN is at the Hi-level, the NAND circuit 144 outputs an output signal NAND_OUT2 indicating the NAND logical operation result of the output signal COMP_OUT and the control signal P_EN. Therefore, the output signal NAND_OUT 1 and the output signal NAND_OUT2 are substantially in an in-phase relationship.

Here, as illustrated in FIG. 3A, the inverter circuit 145 outputs an output signal INV_OUT that is an inverted signal of the output signal NAND_OUT2. Therefore, the output signal NAND_OUT 1 and the output signal INV_OUT are in an inverted relationship with respect to each other.

The AND circuit 146 performs an AND logical operation on the output signal NAND_OUT1 of the NAND circuit 143 and the output signal INV_OUT of the inverter circuit and outputs an output signal representing the result (logical product). The output signal from the AND circuit 146 corresponds to the latch pulse signal LATCH.

In the present embodiment, the logical threshold value of the NAND circuit 143 is different from the logical threshold value of the NAND circuit 144. Specifically, the logical threshold value Vth1 of the NAND circuit 143 is higher than the logical threshold value Vth2 of the NAND circuit 144. With such a configuration, in response to inversion of the output signal NAND_OUT1 of the NAND circuit 143, the latch pulse signal LATCH transitions from the inactive state (low level) to the active state (high level). Further, in response to inversion of the output signal NAND_OUT2 of the NAND circuit 144, the latch pulse signal LATCH transitions from the active state to the inactive state.

The logical threshold values of the NAND circuit 143 and the NAND circuit 144 can be set in accordance with threshold voltages of the PMOS 400, the PMOS 401, the NMOS 402, and the NMOS 403 forming the logic gate unit 450. In general, the threshold voltage of a transistor is set in accordance with a gate length, a gate width, a gate oxide film thickness, or the like of the transistor.

Next, the operation of the signal processing circuit 140 illustrated in FIG. 3A will be described with reference to FIG. 4. FIG. 4 illustrates the control signal P_EN, the control signal SW_EN, the ramp signal RAMP, the output signal COMP_OUT, the output signal NAND_OUT1, the output signal NAND_OUT2, the output signal INV_OUT, and the latch pulse signal LATCH. Further, FIG. 4 illustrates a signal level of the optical signal PIXSIG.

In the initial state at time t40, the signal value (voltage) of the ramp signal RAMP is higher than the signal value of the optical signal PIXSIG, and the output signal COMP_OUT of the comparator 141 indicates a Hi-level VOH. The Hi-level VOH is higher than each of the logic threshold value Vth1 of the NAND circuit 143 and the logic threshold value Vth2 of the NAND circuit 144. Further, the Hi-level VOH may be equal to the power voltage of the power supply node VDD or may be higher than the same.

The control signal P_EN is at the Lo-level, and the control signal SW_EN is at the Hi-level. At this time, both the output signal NAND_OUT1 and the output signal NAND_OUT2 are at the Hi-level, and the output signal INV_OUT is at the Lo-level.

Next, at time t41, the control signal P_EN transitions from the Lo-level to the Hi-level. Thereby, the output signal NAND_OUT1 and the output signal NAND_OUT2 transition from the Hi-level to the Lo-level. This is because the NMOS 402, the NMOS 403, and the NMOS 404 in FIG. 3B are all in the on-state, so that the output terminal Y and the ground node VSS are connected to each other. At this time, both the PMOS 400 and the PMOS 401 are in the off-state.

At time t42, the control signal SW_EN is controlled from the Hi-level to the Lo-level. As a result, each NMOS 404 (the switch unit 404) of the NAND circuit 143 and the NAND circuit 144 is controlled to the off-state. At this time, both the PMOS 400 and the PMOS 401 are in the off-state as described above. That is, the output terminal Y is disconnected from both the power supply node VDD and the ground node VSS. Therefore, the output signal NAND_OUT1 of the NAND circuit 143 is held in the load capacitor 147 in a high impedance state. Similarly, the output signal NAND_OUT2 of the NAND circuit 144 is held in the load capacitor 148 in a high impedance state. The held output signal NAND_OUT1 and the held output signal NAND_OUT2 each indicate the Lo-level.

From time t43, an AD conversion period is started. Specifically, at the time t43, a voltage change of the ramp signal RAMP starts. Therefore, the signal value of the ramp signal RAMP gradually becomes closer to the signal value of the optical signal PIXSIG. At time t44, the level of the output signal COMP_OUT then starts decreasing.

At time t45, when the signal level of the output signal COMP_OUT reaches the logical threshold value Vth1 of the NAND circuit 143, the PMOS 401 forming the NAND circuit 143 is turned on, and the output signal NAND_OUT1 transitions from the Lo-level to the Hi-level. As a result, the Hi-level output signal NAND_OUT1 and the Hi-level output signal INV_OUT are input to the AND circuit 146. Therefore, in response to the change of the output signal NAND_OUT1, the latch pulse signal LATCH transitions from the Lo-level to the Hi-level. At this time, since the NMOS 404 is turned off in the NAND circuit 143, no through current occurs between the power supply node VDD and the ground node VSS of the NAND circuit 143.

Subsequently, at time t46, the level of the output signal COMP_OUT reaches the logic threshold value Vth2 of the NAND circuit 144. The PMOS 401 forming the NAND circuit 144 is turned on, and the output signal NAND_OUT2 transitions from the Lo-level to the Hi-level. Accordingly, the output signal INV_OUT of the inverter circuit 145 transitions from the Hi-level to the Lo-level. As a result, the Hi-level output signal NAND_OUT1 and the Lo-level output signal INV_OUT are input to the AND circuit 146. That is, in response to the change of the output signal NAND_OUT2, the latch pulse signal LATCH transitions from the Hi-level to the Lo-level. At this time, similarly, when the output signal NAND_OUT2 changes, the NMOS 404 is turned off in the NAND circuit 144. Therefore, no through current occurs between the power supply node VDD and the ground node VSS of the NAND circuit 144.

As described above, when the level of the latch pulse signal LATCH transitions, no through current occurs, or the amount of the through current is reduced in the input unit (the NAND circuits 143 and 144) to which the output signal COMP_OUT is input. It is therefore possible to reduce fluctuation of the power voltage of the power supply node VDD or fluctuation of the ground voltage of the ground node VSS. As a result, an accurate latch pulse signal LATCH can be generated, and AD conversion accuracy can be improved.

Further, according to the pulse generation circuit 142 of the present embodiment, even when the lowest level (Lo-level) that can be taken by the output signal COMP_OUT is high, that is, even when the amplitude of the output signal COMP_OUT is small, AD conversion can be accurately performed. At the time t46 of FIG. 4, the signal level of the output signal COMP_OUT reaches the logic threshold value Vth2 of the NAND circuit 144, and at time t47, the signal level of the output signal COMP_OUT reaches a Lo-level VOL. In some circuit configuration of the comparator 141, the Lo-level VOL may be set to a higher voltage than the voltage of the ground node VSS.

Figure 5:
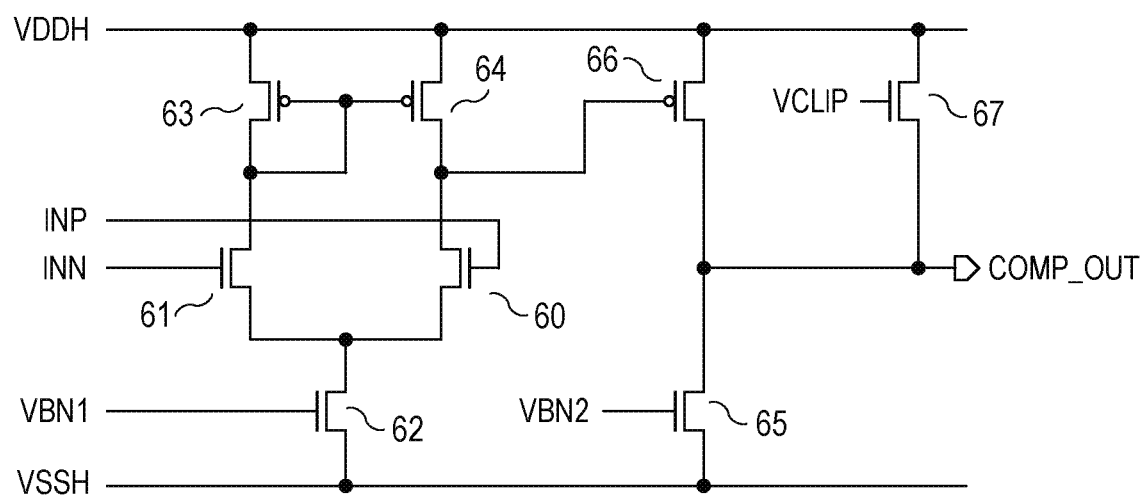
FIG. 5 is a diagram illustrating an equivalent circuit of a comparator.

FIG. 5 illustrates an equivalent circuit diagram of the comparator 141 of the present embodiment. The comparator 141 is formed of NMOSs 60, 61, 62, 65, and 67 and PMOSs 63, 64, and 65. The NMOSs 60, 61, and 62 and the PMOSs 63 and 64 form an N-top-type differential amplifier. The NMOS 65 and the PMOS 66 form a source ground amplifier circuit. The NMOS 67 is a clip circuit that limits and clips the signal value range (the lower limit level in the present embodiment) of the output signal COMP_OUT. An appropriate voltage VCLIP is applied to the gate of the NMOS 67. It is therefore possible to set a lower limit for the output signal COMP_OUT so as to prevent the current of the constant current source (the NMOS 65) of the source ground amplifier circuit from changing sharply.

As described above, when the Lo-level of the output signal COMP_OUT is high, the NMOS 402 of FIG. 3B may not be turned off even when the output signal COMP_OUT is at the Lo-level. Therefore, the through current between the power supply node VDD and the ground node VSS continues to occur, and as a result, significant fluctuation in the power voltage may occur. In contrast, according to the present embodiment, since the switch unit 404 (the NMOS 404) is inserted in series with the logic gate unit, it is possible to reduce generation of the through current described above. As a result, it is possible to accurately perform AD conversion.

Note that, the comparator 141 may be a P-top-type differential amplifier. Further, when a direction of the voltage change of the output signal COMP_OUT is inverted to the direction indicated in FIG. 4, the NAND circuits 143 and 144 of FIG. 3A are replaced with a NOR circuit illustrated in FIG. 6. The NOR circuit of FIG. 6 includes a logic gate unit formed of an NMOS 460, an NMOS 461, a PMOS 462, and a PMOS 463. The NOR circuit further includes a switch unit formed of a PMOS 464. As with the NAND circuits 143 and 144 of FIG. 3A, the logic gate unit and the switch unit of the NOR circuit are connected in series between the power supply node VDD and the ground node VSS. With such a configuration, it is possible to prevent generation of a through current and improve accuracy of AD conversion.

Figure 6:
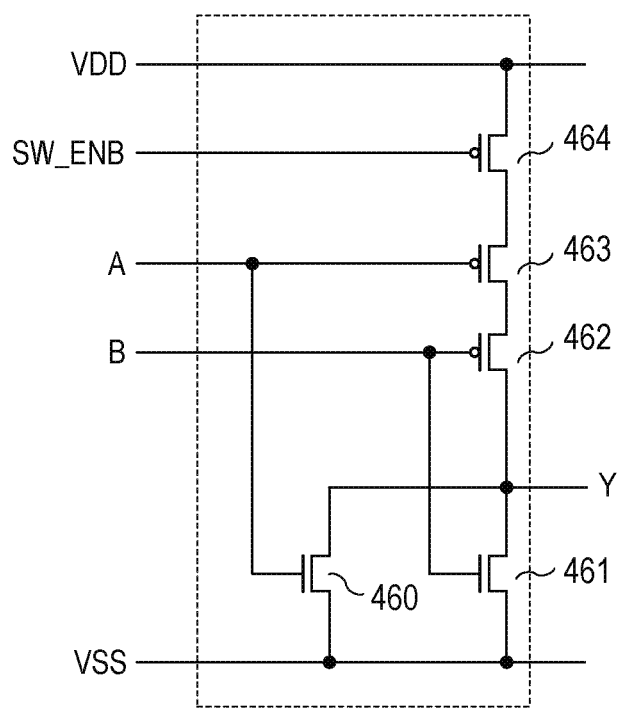
FIG. 6 is a diagram illustrating an equivalent circuit of a logic circuit forming an input unit of a pulse generation circuit.

In addition to the example illustrated in FIG. 3A or FIG. 6, the input unit of the pulse generation circuit 142 may be formed by using an NAND circuit, an AND circuit, a NOR circuit, an OR circuit, an EXOR circuit, a set/reset latch circuit, or the like. Also in such a modified example, a logic circuit forming the input unit includes a logic gate unit and a switch unit connected to the logic gate unit in series. With such a configuration, it is possible to prevent generation of the through current and improve accuracy of AD conversion.

As described above, according to the present embodiment, accuracy of AD conversion can be improved, and as a result, image quality of the imaging device can be improved.

Second Embodiment

A second embodiment will be described with reference to the drawings. The AD conversion device according to the present embodiment is mounted in the photoelectric conversion device and performs AD conversion on a signal based on charge generated by photoelectric conversion.

Figure 7A:
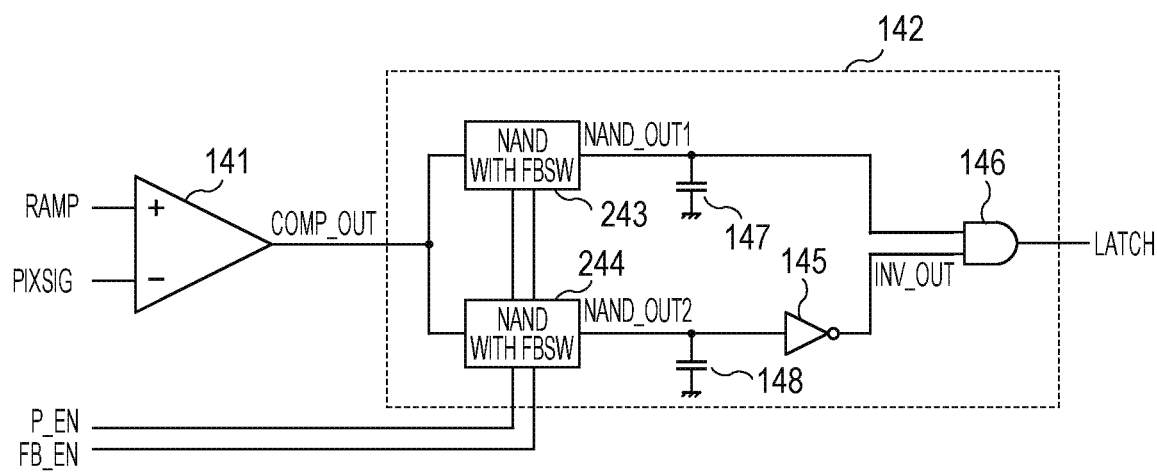
FIG. 7A, FIG. 7B and FIG. 7C are diagrams illustrating equivalent circuits of the signal processing circuit of the imaging device.
Figure 7B:
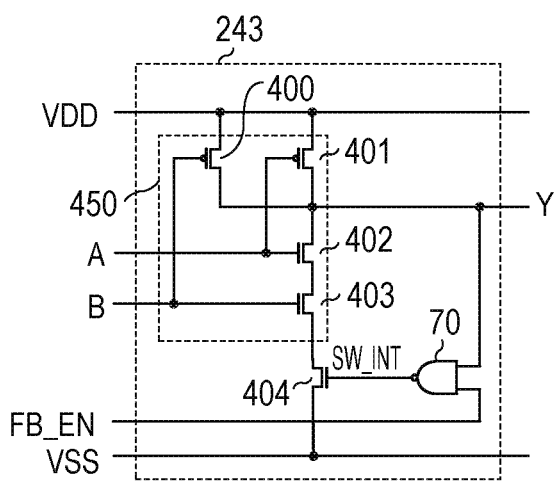
Figure 7C:
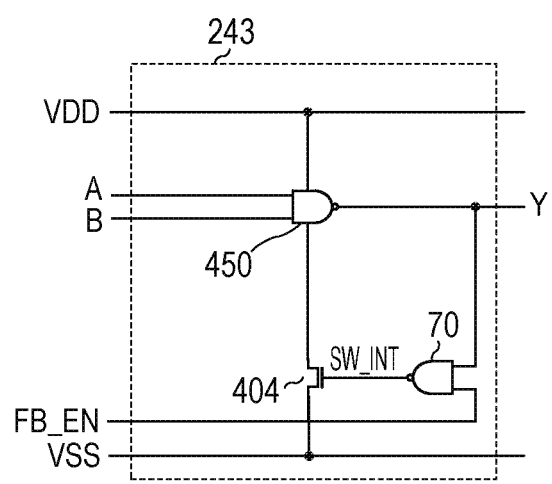

FIG. 7A to FIG. 7C are equivalent circuit diagrams of the signal processing circuit 140 according to the present embodiment. In FIG. 7A to FIG. 7C, the same components as those in FIG. 3A to FIG. 3C are labeled with the same reference as those in FIG. 3A to FIG. 3C, and the description thereof will be omitted. FIG. 7A is a diagram illustrating one example of the equivalent circuit of the signal processing circuit 140. In the present embodiment, the configuration of the logic circuit forming the input unit of the pulse generation circuit 142 is different from that of the first embodiment. Specifically, the NAND circuits 243 and 244 are provided instead of the NAND circuit 143 and the NAND circuit 144, respectively. Further, a control signal FB_EN is input to the NAND circuits 243 and 244 instead of the control signal SW_EN.

FIG. 7B illustrates an equivalent circuit diagram of the NAND circuit 243. Note that the NAND circuit 244 has the same circuit configuration as the NAND circuit 243. Therefore, the description related to the NAND circuit 243 is also applied to the NAND circuit 244 unless otherwise noted.

As illustrated in FIG. 7B, the NAND circuit 243 includes an NAND gate 70 in addition to the logic gate unit 450 and the switch unit 404 (the NMOS 404). The NAND gate 70 has a first input terminal to which the control signal FB_EN is input and a second input terminal connected to the output terminal Y of the logic gate unit 450. An output signal SW_INT of the NAND gate 70 is input to the gate of the NMOS 404. Therefore, in the present embodiment, the NMOS 404 is controlled to be turned on and off in accordance with a signal output from the logic gate unit 450 and a result of the logical operation with respect to the control signal FB_EN.

FIG. 7C illustrates an equivalent circuit of the NAND circuit 243 simplified by using the NAND gate circuit symbol for the logic gate unit 450. As illustrated in FIG. 7C, the logic gate unit 450 and the switch unit 404 are connected to each other so as to form a current path between the power supply node VDD and the ground node VSS.

In the present embodiment, the logical threshold value of the NAND circuit 243 and the logical threshold value of the NAND circuit 244 are different from each other. Specifically, the logical threshold value Vth1 of the NAND circuit 243 is higher than the logical threshold value Vth2 of the NAND circuit 244. With such a configuration, the latch pulse signal LATCH is generated in the same manner as the first embodiment.

Next, the operation of the signal processing circuit 140 illustrated in FIG. 7A will be described with reference to FIG. 8. FIG. 8 is a timing chart diagram of signals used for the signal processing circuit 140 of the present embodiment. Specifically, FIG. 8 illustrates the control signal FB_EN, an output signal SW_INT1, and an output signal SW_INT2. In FIG. 8, the output signal SW_INT1 indicates the output signal SW_INT of the NAND gate 70 of the NAND circuit 243. Further, the output signal SW_INT2 indicates the output signal SW_INT of the NAND gate 70 of the NAND circuit 244. In FIG. 8, signals having the same reference as those in FIG. 4 represent the same meaning, and the description thereof will be omitted.

In the initial state at time t80, the signal value (voltage) of the ramp signal RAMP is higher than the signal value of the optical signal PIXSIG, and the output signal COMP_OUT of the comparator 141 indicates the Hi-level VOH.

The control signal P_EN is at the Lo-level, and the control signal FB_EN is at the Lo-level. At this time, both the output signal NAND_OUT1 and the output signal NAND_OUT2 are at the Hi-level, and the output signal INV_OUT is at the Lo-level. Further, both the output signal SW_INT1 and the output signal SW_INT2 are at the Hi-level.

Next, at time t81, the control signal P_EN transitions from the Lo-level to the Hi-level. Thereby, the output signal NAND_OUT1 and the output signal NAND_OUT2 transition from the Hi-level to the Lo-level, respectively.

At time t82, the control signal FB_EN transitions from the Lo-level to the Hi-level. When the output signal NAND_OUT1 or the output signal NAND_OUT2 transitions from the Lo-level to the Hi-level in such a condition, the corresponding output signal SW_INT1 or SW_INT2 transitions from the Hi-level to the Lo-level. That is, the NMOS 404 is turned off in response to the change of the output signal COMP_OUT from the comparator 141.

In FIG. 8, an AD conversion period is started from time t83. Specifically, at the time t83, a voltage change of the ramp signal RAMP starts. Therefore, the signal value of the ramp signal RAMP gradually becomes closer to the signal value of the optical signal PIXSIG. At time t84, the level of the output signal COMP_OUT then starts decreasing.

At time t85, when the signal level of the output signal COMP_OUT reaches the logical threshold value Vth1 of the NAND circuit 243, the PMOS 401 forming the NAND circuit 243 is turned on, and the output signal NAND_OUT1 transitions from the Lo-level to the Hi-level. As a result, the Hi-level output signal NAND_OUT1 and the Hi-level output signal INV_OUT are input to the AND circuit 146. Therefore, in response to the change of the output signal NAND_OUT1, the latch pulse signal LATCH transitions from the Lo-level to the Hi-level.

At this time, the output signal SW_INT1 of the NAND gate 70 of the NAND circuit 243 transitions from the Hi-level to the Lo-level. Therefore, before the signal level of the output signal COMP_OUT reaches the level of the ground voltage (or the Lo-level VOL), the NMOS 404 of the NAND circuit 243 is turned off. Thereby, the through current between the power supply node and the ground node can be reduced in the NAND circuit 243. The same operation is performed in the NAND circuit 244 from time t86.

As described above, when the level of the latch pulse signal LATCH transitions, no through current occurs, or the amount of the through current is reduced in the input unit (the NAND circuits 143 and 144) to which the output signal COMP_OUT is input. It is therefore possible to reduce fluctuation of the power voltage of the power supply node VDD and fluctuation of the ground voltage of the ground node VSS. As a result, an accurate latch pulse signal LATCH can be generated, and AD conversion accuracy can be improved.

Further, in the present embodiment, when each output of the NAND circuits 243 and 244 is inverted during an AD conversion period, the corresponding switch unit 404 (the NMOS 404) is turned off. Therefore, the output signals NAND_OUT1 and NAND_OUT2 are not in a high impedance state. Therefore, since there is no period in which the output signals NAND_OUT1 and NAND_OUT2 are held, the load capacitors 147 and 148 can be omitted.

Note that, also in the present embodiment, the same modified example as that described in the first embodiment is applied.

Third Embodiment

Figure 9:
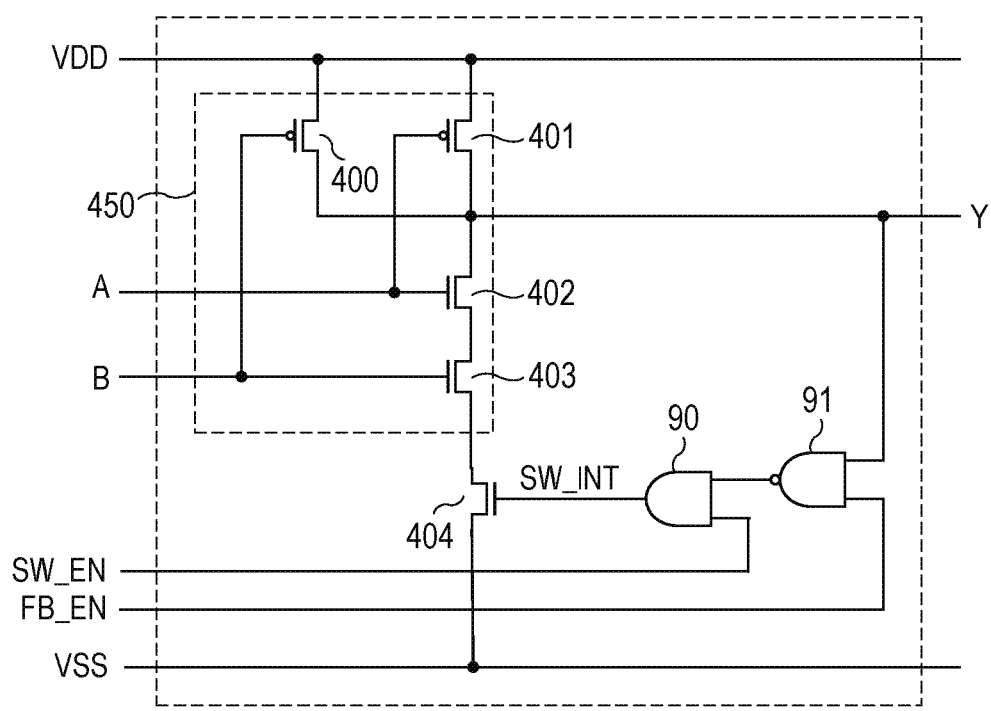
FIG. 9 is a diagram illustrating the equivalent circuit of the logic circuit forming the input unit of the pulse generation circuit.

FIG. 9 is an equivalent circuit diagram of an input unit of the pulse generation circuit 142 according to a third embodiment. By using a circuit configuration illustrated in FIG. 9 instead of the NAND circuits 143 and 144 in the first embodiment and the NAND circuits 243 and 244 in the second embodiment, it is possible to use the driving operation of the first embodiment or the driving operation of the second embodiment in accordance with a situation by switching of these driving operations.

In FIG. 9, the output signal SW_INT of an AND circuit 90 is input to the gate of the NMOS 404. The control signal SW_EN is input to one of the input terminals of the AND circuit 90, and the other is connected to the output of an NAND circuit 91. Further, the control signal FB_EN is input to one of the input terminals of an NAND circuit 91, and the other is connected to the output Y of the two-input NAND circuit 450.

When the control signal FB_EN is at the Lo-level, the driving operation as illustrated in FIG. 4 of the first embodiment can be performed. Further, when the control signal SW_EN is at the Hi-level, the driving operation as illustrated in FIG. 8 of the second embodiment can be performed.

As described above, according to the present embodiment, since it is possible to select a driving operation by which the through current is less likely to occur during an AD conversion period in accordance with the situation, and as a result, it is possible to improve image quality.

Fourth Embodiment

Figure 10:
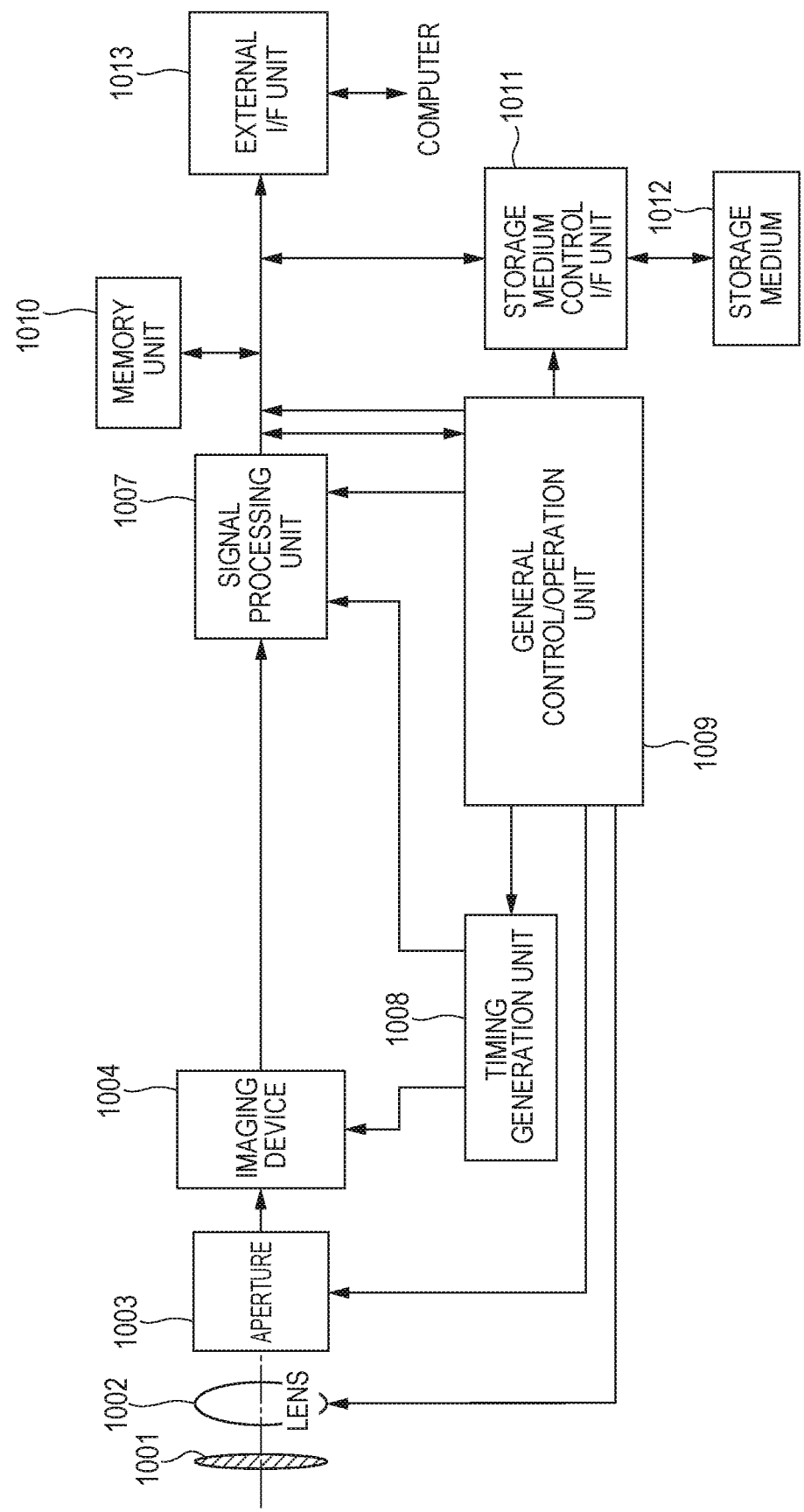
FIG. 10 is a block diagram of an embodiment of an imaging system.

An embodiment of a photoelectric conversion system will be described. The photoelectric conversion system may be a digital still camera, a digital camcorder, a surveillance camera, a camera head, a copying machine a fax machine, a mobile phone, an on-vehicle camera, an observation satellite, or the like. FIG. 10 illustrates a block diagram of a camera as an example of the photoelectric conversion system.

In FIG. 10, the reference 1001 is a barrier used for protecting a lens. The reference 1002 is a lens that captures an optical image of a subject onto an imaging device 1004. The reference 1003 is an aperture used for changing a light amount that has passed through the lens 1002. The photoelectric conversion device described above in each embodiment is used for the imaging device 1004.

The reference 1007 is a signal processing unit that performs processing such as correction, data compression, or the like on pixel signals output from the imaging device 1004 to acquire image signals. In addition, in the FIG. 10, the reference 1008 is a timing generation unit that outputs various timing signals to the imaging device 1004 and the signal processing unit 1007, and the reference 1009 is a general control unit that controls the entire camera. The reference 1010 is a frame memory unit used for temporarily storing image data. The reference 1011 is an interface unit used for performing storage or readout on a storage medium. The reference 1012 is a removable storage medium such as a semiconductor memory used for performing storage or readout of captured data. The reference 1013 is an interface unit used for communicating with an external computer or the like.

Note that the camera system may include at least the imaging device 1004 and the lens 1002 that captures light from the subject onto the imaging device 1004.

As described above, in the embodiment of the photoelectric conversion system, an imaging device of each of the embodiments described above is used in the imaging device 1004. With such a configuration, accuracy in AD conversion can be improved in a camera system.

Fifth Embodiment

Figure 11A:
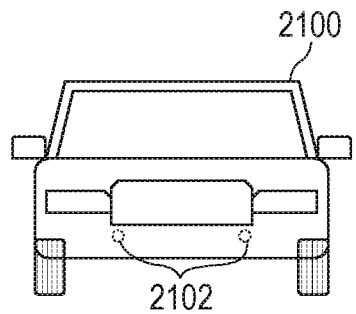
FIG. 11A, FIG. 11B, FIG. 11C and FIG. 11D are diagrams of an embodiment of a movable object.
Figure 11B:
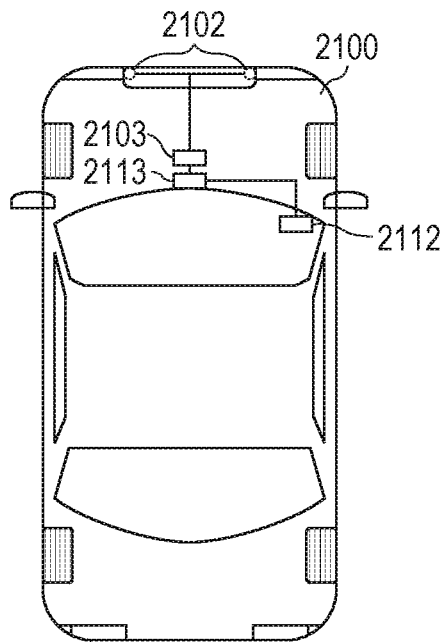
Figure 11C:
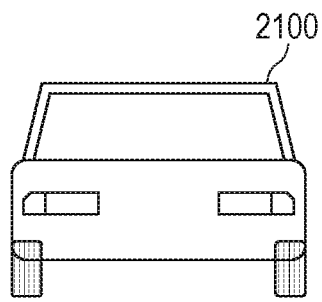

An embodiment of a movable object will be described. The movable object of the present embodiment is a vehicle having an on-vehicle camera. FIG. 11A, FIG. 11B and FIG. 11C schematically illustrate the appearance and the main inner structure of a vehicle 2100. The vehicle 2100 includes an imaging device 2102, an integrated circuit (Application Specific Integrated Circuit (ASIC)) 2103 for the imaging system, an alert device 2112, and a main control unit 2113.

For the imaging device 2102, any of the photoelectric conversion devices described in the embodiments described above is used. In response to receiving a signal indicating an anomaly from the imaging system, a vehicle sensor, a control unit, or the like, the alert device 2112 alerts a driver. The main control unit 2113 generally controls the operation of the imaging system, the vehicle sensor, the control unit, or the like. Note that the vehicle 2100 may not include the main control unit 2113. In such a case, the imaging system, the vehicle sensor, and the control unit may include separate communication interfaces and performs transmission and reception of control signals via the communication network (for example, CAN specification), respectively.

Figure 11D:
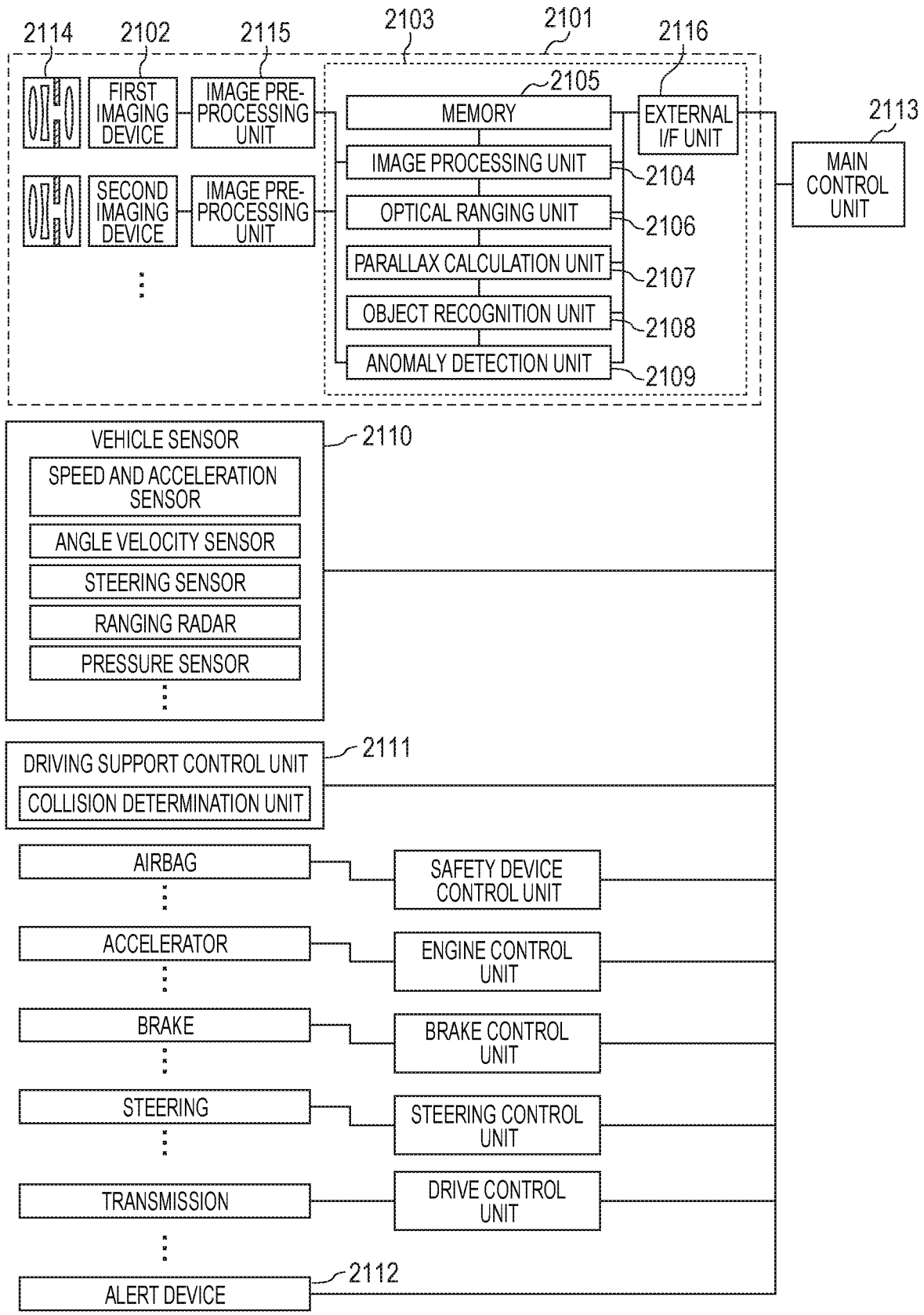

FIG. 11D is a block diagram illustrating a system configuration of the vehicle 2100. The vehicle 2100 includes a first imaging device 2102 and a second imaging device 2102. That is, the on-vehicle camera of the present embodiment is a stereo camera. A subject image is captured on the imaging device 2102 by an optical unit 2114. Pixel signals output from the imaging device 2102 are processed by an image preprocessing unit 2115 and transferred to an integrated circuit 2103 for the imaging system. The image preprocessing unit 2115 performs a process such as S-N calculation, synchronization signal addition, or the like.

The integrated circuit 2103 for the imaging system includes an image processing unit 2104, a memory 2105, an optical ranging unit 2106, a parallax calculation unit 2107, an object recognition unit 2108, an anomaly detection unit 2109, and an external interface (I/F) unit 2116. The image processing unit 2104 processes a pixel signal to generate an image signal. Further, the image processing unit 2104 performs image signal correction or anomaly pixel compensation. The memory 2105 temporarily stores an image signal. Further, the memory 2105 may store a known position of an anomaly pixel in the imaging device 2102. The optical ranging unit 2106 performs focusing or ranging of a subject by using image signals. The parallax calculation unit 2107 performs subject matching (stereo matching) of the parallax images. The object recognition unit 2108 analyzes the image signals to recognize a subject such as an automobile, a person, a traffic sign, a road, or the like. The anomaly detection unit 2109 detects damage or malfunction of the imaging device 2102. In response to detecting damage or malfunction, the anomaly detection unit 2109 transmits a signal indicating the detection of an anomaly to a main control unit 2113. The external I/F unit 2116 mediates transmission and reception of information between each unit of the integrated circuit 2103 for the imaging system and the main control unit 2113 or various control units or the like.

The vehicle 2100 includes a vehicle information acquisition unit 2110 and a driving support unit 2111. The vehicle information acquisition unit 2110 includes a vehicle sensor such as a speed and acceleration sensor, an angle velocity sensor, a rudder angle sensor, a ranging radar, a pressure sensor, or the like.

The driving support unit 2111 includes a collision determination unit. The collision determination unit determines whether or not there is a collision possibility with an object based on information from the optical ranging unit 2106, the parallax calculation unit 2107, or the object recognition unit 2108. The optical ranging unit 2106 or the parallax calculation unit 2107 is an example of a distance information acquisition unit that acquires distance information on the distance to the object. That is, the distance information is information on a parallax, a defocus amount, a distance to an object, or the like. The collision determination unit may use any of the distance information to determine the collision possibility. The distance information acquisition unit may be implemented by dedicatedly designed hardware or may be implemented by a software module.

Although the example in which the driving support unit 2111 controls the vehicle 2100 so as to avoid a collision with another object has been described above, the embodiment is also applicable to automatic driving control for following another vehicle, automatic driving control for not going out of a traffic lane, or the like.

The vehicle 2100 is further provided with a drive unit used for traveling, such as an airbag, an accelerator, a brake, a steering, a transmission, or the like. Further, the vehicle 2100 further includes a control unit for these components. The control unit controls the corresponding drive unit based on a control signal of the main control unit 2113.

As described above, in the embodiment of a vehicle, the imaging device of any of the embodiments described above is used for the imaging device 2102. With such a configuration, it is possible to improve accuracy of AD conversion.

According to the disclosure, accuracy of AD conversion can be improved.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2018-219744, filed Nov. 22, 2018, which is hereby incorporated by reference herein in its entirety.

What is claimed is:

1. An analog-to-digital conversion device comprising:
a comparator; and
a logic circuit including a switch unit and a logic gate unit that receives a signal output from the comparator,
wherein the logic gate unit has a first transistor and a second transistor of a first conductivity type, and a third transistor and a fourth transistor of a second conductivity type,
wherein a first signal output from the comparator is input to the first transistor and the third transistor,
wherein a second signal is input to the second transistor and the fourth transistor,
wherein the first transistor, the second transistor and the third transistor are connected to an output node, and
wherein the first transistor, the third transistor, the fourth transistor and the switch unit are connected in series, in this order, between a first power supply node and a second power supply node.

2. The analog-to-digital conversion device according to claim 1,
wherein the logic gate unit performs a logical operation on at least two signals including the signal output from the comparator, and
wherein the switch unit is controlled to be an on-state or an off-state by a control signal separate from the at least two signals.

3. The analog-to-digital conversion device according to claim 1, wherein the logic gate unit receives the signal output from the comparator and a first third signal that controls whether or not to perform analog-to-digital conversion based on the signal output from the comparator.

4. The analog-to-digital conversion device according to claim 2, wherein the logic gate unit receives the signal output from the comparator and a third signal that controls whether or not to perform analog-to-digital conversion based on the signal output from the comparator.

5. The analog-to-digital conversion device according to claim 3, wherein the switch unit is in an off-state in at least a part of a period in which the third signal has a signal value corresponding to a state where analog-to-digital conversion is performed.

6. The analog-to-digital conversion device according to claim 4, wherein the switch unit is in an off-state in at least a part of a period in which the third signal has a signal value corresponding to a state where analog-to-digital conversion is performed.

7. The analog-to-digital conversion device according to claim 1,
wherein the logic circuit further includes a second logic gate unit,
wherein the logic gate unit performs a logical operation on at least two signals including the signal output from the comparator,
wherein the second logic gate unit performs a logical operation on a signal output from the logic gate unit and a control signal separate from the at least two signals, and
wherein the switch unit is controlled to an on-state or an off-state by the signal output from the second logic gate unit.

8. The analog-to-digital conversion device according to claim 1 further comprising a signal generation circuit that supplies a ramp signal to the comparator, wherein the switch unit is in an off-state in at least a part of a period from start of a change to end of the change in the signal value of the ramp signal.

9. The analog-to-digital conversion device according to claim 1 further comprising a clip circuit that limits a range of a signal value of a signal output from the comparator.

10. The analog-to-digital conversion device according to claim 1,
wherein the logic circuit includes a first logic circuit and a second logic circuit each including the logic gate unit and the switch unit, and
wherein, in each of the first logic circuit and the second circuit, the logic gate unit and the switch unit are connected to each other in series between the power supply node and the ground node.

11. The analog-to-digital conversion device according to claim 10 further comprising:
an inverter circuit connected to an output terminal of the second logic circuit; and
a third logic circuit that receives a signal output from the first logic circuit and a signal output from the inverter circuit.

12. The analog-to-digital conversion device according to claim 10, wherein a threshold voltage of a transistor included in the first logic circuit and a threshold voltage of a transistor included in the second logic circuit are different from each other.

13. The analog-to-digital conversion device according to claim 11, wherein a threshold voltage of a transistor included in the first logic circuit and a threshold voltage of a transistor included in the second logic circuit are different from each other.

14. A photoelectric conversion device comprising:
a photoelectric conversion unit; and
the analog-to-digital conversion device according to claim 1,
wherein a signal based on charge generated in the photoelectric conversion unit is input to the comparator.

15. A photoelectric conversion system comprising:
the photoelectric conversion device according to claim 14; and
a signal processing device that processes a signal from the photoelectric conversion device.

16. A movable object comprising:
the photoelectric conversion system according to claim 15; and
a control unit that controls the movable object based on pixel signals acquired by the photoelectric conversion system.

17. An analog-to-digital conversion device comprising:
a comparator; and
a logic circuit including a switch unit and a logic gate unit that receives a signal output from the comparator,
wherein the logic gate unit and the switch unit are connected to each other in series between a first power supply node and a second power supply node,
wherein the logic circuit further includes a second logic gate unit,
wherein the logic gate unit performs a logical operation on at least two signals including the signal output from the comparator,
wherein the second logic gate unit performs a logical operation on a signal output from the logic gate unit and a control signal separate from the at least two signals, and
wherein the switch unit is controlled to an on-state or an off-state by the signal output from the second logic gate unit.

18. An analog-to-digital conversion device comprising:
a comparator;
a logic circuit including a switch unit and a logic gate unit that receives a signal output from the comparator;
an inverter circuit connected to an output terminal of the second logic circuit; and
a third logic circuit that receives a signal output from the first logic circuit and a signal output from the inverter circuit,
wherein the logic gate unit and the switch unit are connected to each other in series between a first power supply node and a second power supply node,
wherein the logic circuit includes a first logic circuit and a second logic circuit each including the logic gate unit and the switch unit, and
wherein, in each of the first logic circuit and the second logic circuit, the logic gate unit and the switch unit are connected to each other in series between the first power supply node and a second power supply node.

* * * * *